(12) United States Patent
Gong et al.

(10) Patent No.: US 11,785,810 B2
(45) Date of Patent: *Oct. 10, 2023

(54) DISPLAY SUBSTRATE, MANUFACTURING METHOD THEREOF, AND DISPLAY DEVICE

(71) Applicants: HEFEI BOE OPTOELECTRONICS TECHNOLOGY CO., LTD., Anhui (CN); BOE TECHNOLOGY GROUP CO., LTD., Beijing (CN)

(72) Inventors: Kui Gong, Beijing (CN); Xianxue Duan, Beijing (CN)

(73) Assignees: HEFEI BOE OPTOELECTRONICS TECHNOLOGY CO., LTD., Anhui (CN); BOE TECHNOLOGY GROUP CO., LTD., Beijing (CN)

(*) Notice: Subject to any disclaimer, the term of this patent is extended or adjusted under 35 U.S.C. 154(b) by 0 days.

This patent is subject to a terminal disclaimer.

(21) Appl. No.: 17/644,056

(22) Filed: Dec. 13, 2021

(65) Prior Publication Data

US 2022/0102450 A1 Mar. 31, 2022

Related U.S. Application Data

(63) Continuation of application No. 16/079,131, filed as application No. PCT/CN2018/074423 on Jan. 29, 2018, now Pat. No. 11,211,435.

(30) Foreign Application Priority Data

Jun. 14, 2017 (CN) .......................... 201710449807.7

(51) Int. Cl.
*H01L 23/00* (2006.01)
*H10K 59/122* (2023.01)
(Continued)

(52) U.S. Cl.
CPC .......... *H10K 59/122* (2023.02); *H10K 50/15* (2023.02); *H10K 50/16* (2023.02); *H10K 50/17* (2023.02);
(Continued)

(58) Field of Classification Search
CPC ..... H10K 59/122; H10K 71/233; H10K 71/00
See application file for complete search history.

(56) References Cited

U.S. PATENT DOCUMENTS 11,211,435 B2 * 12/2021 Gong ..................... H10K 71/00
2007/0152575 A1 7/2007 Lee et al.
(Continued)

FOREIGN PATENT DOCUMENTS

| CN | 1992333 A | 7/2007 |
|----|-----------|--------|
| CN | 101630689 A | 1/2010 |

(Continued)

OTHER PUBLICATIONS

First Office Action for Chinese Application No. 201710449807.7, dated May 13, 2019, 5 Pages.
(Continued)

*Primary Examiner* — Anthony Ho
(74) *Attorney, Agent, or Firm* — BROOKS KUSHMAN P.C.

(57) ABSTRACT

A display substrate, a manufacturing method thereof, and a display device. The method includes: forming a pixel definition layer transitional pattern on a base substrate, the pixel definition layer transitional pattern being provided at a lateral surface with an undercut; forming a common layer, which is broken at the undercut, on the base substrate; removing the undercut to obtain a pattern of a pixel definition layer; and forming a cathode on the base substrate.

18 Claims, 4 Drawing Sheets

(51) Int. Cl.

| | |
|---|---|
| *H10K 50/15* | (2023.01) |
| *H10K 50/16* | (2023.01) |
| *H10K 50/17* | (2023.01) |
| *H10K 50/822* | (2023.01) |
| *H10K 71/00* | (2023.01) |
| *H10K 71/20* | (2023.01) |
| *H10K 59/12* | (2023.01) |

(52) U.S. Cl.
CPC ......... *H10K 50/171* (2023.02); *H10K 50/822* (2023.02); *H10K 71/00* (2023.02); *H10K 71/233* (2023.02); *H10K 71/621* (2023.02); *H10K 59/1201* (2023.02)

(56) References Cited

U.S. PATENT DOCUMENTS

| | | |
|---|---|---|
| 2010/0013379 A1 | 1/2010 | Park |
| 2010/0258810 A1 | 10/2010 | Liao et al. |
| 2012/0086881 A1 | 4/2012 | Kim et al. |
| 2016/0268354 A1 | 9/2016 | Xiong et al. |
| 2018/0108781 A1 | 4/2018 | Fang et al. |

FOREIGN PATENT DOCUMENTS

| | | |
|---|---|---|
| CN | 102445802 A | 5/2012 |
| CN | 103794634 A | 5/2014 |
| CN | 104659070 A | 5/2015 |
| CN | 105449127 A | 3/2016 |
| CN | 105895664 A | 8/2016 |
| TW | 201037436 A | 10/2010 |

OTHER PUBLICATIONS

International Search Report and Written Opinion for Application No. PCT/CN2018/074423, dated Apr. 9, 2018, 10 Pages.
Non-final Rejection for copending U.S. Appl. No. 16/079,131, dated May 13, 2021, 9 Pages.

* cited by examiner

DISPLAY SUBSTRATE, MANUFACTURING METHOD THEREOF, AND DISPLAY DEVICE

CROSS-REFERENCE TO RELATED APPLICATIONS

This application is a Continuation of U.S. patent application Ser. No. 16/079,131 filed Aug. 23, 2018, which is the U.S. national phase of PCT Application No. PCT/CN2018/074423 filed on Jan. 29, 2018, which claims priority to Chinese Patent Application No. 201710449807.7 filed on Jun. 14, 2017, which are incorporated herein by reference in their entireties.

TECHNICAL FIELD

The present disclosure relates to a display substrate, a manufacturing method thereof and a display device.

BACKGROUND

Due to such advantages as self-luminescence, high brightness, wide viewing angle, high contrast, being flexible and low power consumption, an organic light-emitting diodes (OLED) display device, as a new-generation display device, has attracted more and more attentions and has gradually replaced a conventional liquid crystal display device, which is widely used in mobile phone screens, computer displays and full-color televisions. Different from a conventional liquid crystal display technology, for an OLED display technology, it is unnecessary to provide back light, and a very thin organic material layer and a very thin glass substrate may be adopted. When a current flows through the organic material layer, the organic material layer may emit light. The OLED display device has such many advantages, for example, being capable of achieving a flexible display. A flexible OLED panel may be achieved, if a flexible plastic substrate is adopted as a carrier, and a thin film encapsulation process is adopted.

SUMMARY

Embodiments of the present disclosure provide the following technical solutions.

In one aspect, the present disclosure provides in some embodiments a method for manufacturing a display substrate, which includes:
forming a pixel definition layer transitional pattern on a base substrate, the pixel definition layer transitional pattern being provided at a lateral surface with an undercut;
forming a common layer, that is broken at the undercut, on the base substrate;
removing the undercut to obtain a pattern of a pixel definition layer; and
forming a cathode on the base substrate.

Optionally, the removing the undercut to obtain the pattern of the pixel definition layer includes: heating the pixel definition layer transitional pattern to melt a part of the pixel definition layer transitional pattern, in such a manner to remove the undercut and form a gentle slope, to obtain the pattern of the pixel definition layer.

Optionally, the forming the pixel definition layer transitional pattern on the base substrate includes: forming at least two dam members on the base substrate, which are located in a direction perpendicular to the base substrate. The pixel definition layer transitional pattern includes the at least two dam members, and the undercut is formed between two of the at least two dam members.

Optionally, the forming the at least two dam members on the base substrate includes: forming, on the base substrate, a first dam member, a second dam member arranged on the first dam member and a third dam member arranged on the second dam member. An orthogonal projection of a top surface of the second dam member onto the base substrate completely falls within an orthogonal projection of a bottom surface of the third dam member onto the base substrate, and an edge of the orthogonal projection of the top surface of the second dam member onto the base substrate is spaced apart by a certain distance from an edge of the orthogonal projection of the bottom surface of the third dam member onto the base substrate.

Optionally, the forming, on the base substrate, the first dam member, the second dam member arranged on the first dam member and the third dam member arranged on the second dam member includes:
forming a first photosensitive material layer;
exposing a portion of the first photosensitive material layer having a thickness d relative to an upper surface of the first photosensitive material layer, to form an exposed film layer, the first photosensitive material layer having a thickness D, and D being larger than d;
forming a second photosensitive material layer on the exposed first photosensitive material layer;
exposing portions of the first photosensitive material layer and the second photosensitive material layer not shielded by a light-shielding pattern of a mask plate, an orthogonal projection of the light-shielding pattern onto the base substrate overlapping an orthogonal projection of the pixel definition layer onto the base substrate; and
developing the exposed first photosensitive material layer and the exposed second photosensitive material layer to form the first dam member, the second dam member and the third dam member.

Optionally, the heating the pixel definition layer transitional pattern to melt a part of the pixel definition layer transitional pattern, in such a manner to remove the undercut and form a gentle slope includes:
heating the pixel definition layer transitional pattern to melt a portion of the pixel definition layer transitional pattern, in such a manner to enable lateral surfaces of the first dam member, the second dam member and the third dam member to be connected as the gentle slope.

Optionally, the thickness d of the exposed film layer is $\frac{1}{10}D$ to $\frac{1}{5}D$.

Optionally, a thickness d1 of the second photosensitive material layer is $\frac{1}{5}D$ to $\frac{1}{3}D$, and d1 is larger than d.

Optionally, the forming the at least two dam members on the base substrate includes forming, on the base substrate, the second dam member and the third dam member arranged on the second dam member. An orthogonal projection of a top surface of the second dam member onto the base substrate completely falls within an orthogonal projection of a bottom surface of the third dam member onto the base substrate, and an edge of the orthogonal projection of the top surface of the second dam member onto the base substrate is spaced apart by a certain distance from an edge of the orthogonal projection of the bottom surface of the third dam member onto the base substrate.

Optionally, the forming, on the base substrate, the second dam member and the third dam member arranged on the second dam member includes:
forming a first photosensitive material layer;

exposing the entire first photosensitive material layer;

forming a second photosensitive material layer on the exposed first photosensitive material layer;

exposing portions of the first photosensitive material layer and the second photosensitive material layer not shielded by a light-shielding pattern of a mask plate, an orthogonal projection of the light-shielding pattern onto the base substrate overlapping an orthogonal projection of the pixel definition layer onto the base substrate; and developing the exposed first photosensitive material layer and the exposed second photosensitive material layer to form the second dam member and the third dam member.

Optionally, the heating the pixel definition layer transitional pattern to melt a part of the pixel definition layer transitional pattern, in such a manner to remove the undercut and form the gentle slope includes:

heating the pixel definition layer transitional pattern to melt the portion of the pixel definition layer transitional pattern, in such a manner to enable lateral surfaces of the second dam member and the third dam member to be connected as the gentle slope.

Optionally, the heating the pixel definition layer transitional pattern includes:

heating the pixel definition layer transitional pattern at a temperature of 80° C. to 100° C. for 12 to 48 hours.

Optionally, the forming the common, that is broken at the undercut, on the base substrate includes:

forming the common layer on the base substrate, where the common layer includes a first common layer portion at a pixel region defined by the pixel definition layer transitional pattern and a second common layer portion at a top surface of the pixel definition layer transitional pattern, and the first common layer portion and the second common layer portion are unconnected to each other.

Optionally, the forming the common layer on the base substrate includes:

forming a hole injection layer and a hole transport layer sequentially on the base substrate, each of the hole injection layer and the hole transport layer being broken at the undercut at the lateral surface of the pixel definition layer transitional pattern, one portion of each of the hole injection layer and the hole transport layer being located at the pixel region, the other portion being located at the top surface of the pixel definition transitional pattern; and forming an electron transport layer and an electron injection layer sequentially, each of the electron transport layer and the electron injection layer being broken at the undercut at the lateral surface of the pixel definition layer transitional pattern, one portion of each of the electron transport layer and the electron injection layer being located at the pixel region, the other portion being located at the top surface of the pixel definition transitional pattern.

In another aspect, the present disclosure provides in some embodiments a display substrate manufactured through the above-mentioned method. A pattern of a pixel definition layer includes a first film layer and a second film layer, and the first film layer is arranged at a side of the second film layer adjacent to a base substrate, and an etching rate of the first film layer is larger than an etching rate of the second film layer.

Optionally, the pattern of the pixel definition layer further includes a third film layer arranged at a side of the first film layer adjacent to the base substrate, and an etching rate of the third film layer is smaller than the etching rate of the first film layer.

Optionally, a common layer is broken at a boundary between the first film layer and the second film layer, and a cathode is continuous at the boundary between the first film layer and the second film layer.

In yet another aspect, the present disclosure provides in some embodiments a display device including the above-mentioned display substrate.

DETAILED DESCRIPTION

Figure 1:
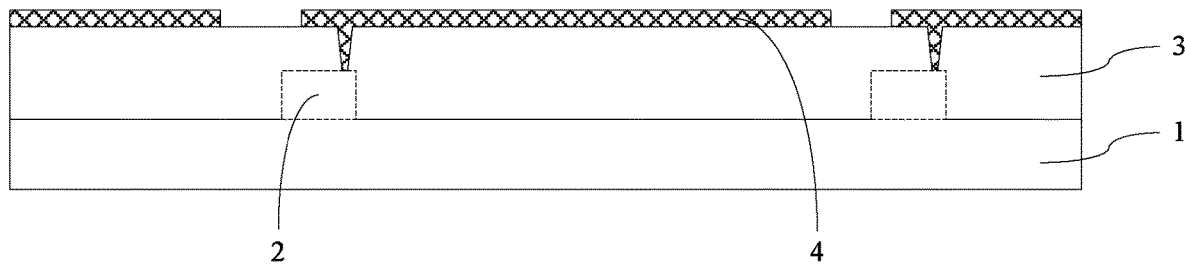
FIG. 1 is a schematic diagram showing the formation of an anode on a base substrate according to one embodiment of the present disclosure.

In order to make the objects, the technical solutions and the advantages of the present disclosure more apparent, the present disclosure will be described hereinafter in detail in conjunction with the drawings and embodiments.

Inventors found in research that, for an OLED display substrate in the related art, a common layer having a relatively large thickness is deposited on a base substrate with a pattern of a pixel definition layer, and portions of the common layer at different pixel regions are connected to each other. In this way, holes to be provided to each subpixel may probably be transported to an adjacent subpixel via the common layer. In this case, there is a leakage current between the adjacent subpixels, and thus light leakage may occur to an OLED display device.

Embodiments of the present disclosure provide a display substrate, a manufacturing method thereof and a display device, so as to prevent the occurrence of the leakage current between the adjacent subpixels, thereby to improve display quality of the display device.

The present disclosure provides in some embodiments a method for manufacturing a display substrate, including: forming a pixel definition layer transitional pattern on a base substrate, the pixel definition layer transitional pattern being provided at a lateral surface with an undercut; forming a common layer on the base substrate with the pixel definition layer transitional pattern; removing the undercut to obtain a pattern of a pixel definition layer; and forming a cathode on the base substrate.

According to the embodiments of the present disclosure, the undercut is formed at the lateral surface of the pixel definition layer transitional pattern. When the common layer is formed on the base substrate with the pixel definition layer transitional pattern, the common layer may be broken at the lateral surface of the pixel definition layer transitional pattern. In this case, one portion of the common layer is located at a pixel region defined by the pixel definition layer transitional pattern, and the other portion of the common layer is located at a top surface of the pixel definition layer transitional pattern, so the portions of the common layer at different pixel regions are separated from each other. As a result, the holes to be provided to each subpixel are incapable of being transported to an adjacent subpixel via the common layer, so as to prevent the occurrence of the leakage current between the adjacent subpixels, thereby to improve a display effect of a display device.

A pixel definition layer in the display substrate manufactured according to the above method includes at least two layers, e.g., a first film layer and a second film layer laminated one on another. The first film layer is arranged at a side of the second film layer adjacent to the base substrate, and an etching rate of the first film layer is larger than an etching rate of the second film layer. In such a manner, when the pixel definition layer transitional pattern is formed through etching during manufacturing the display substrate, the first film layer is indented inward relative to the second film layer, so as to form the undercut.

In some embodiments of the present disclosure, apart from the first film layer and the second film layer, the pixel definition layer may further include a third film layer arranged at a side of the first film layer adjacent to the base substrate, and an etching rate of the third film layer is smaller than the etching rate of the first film layer.

Optionally, the forming the pixel definition layer transitional pattern includes forming at least two dam members on the base substrate.

In some embodiments of the present disclosure, the forming the pixel definition layer transitional pattern includes:

forming a first photosensitive material layer; exposing a portion of the first photosensitive material layer so as to form an exposed layer; forming a second photosensitive material layer on the exposed first photosensitive material layer; exposing portions of the first photosensitive material layer and the second photosensitive material layer not shielded by a light-shielding pattern of a mask plate, an orthogonal projection of the light-shielding pattern onto the base substrate overlapping, e.g., falling within, an orthogonal projection of the pixel definition layer onto the base substrate; developing the exposed first photosensitive material layer and the exposed second photosensitive material layer, so as to form the pixel definition layer transitional pattern. The pixel definition layer transitional pattern includes a first dam member, a second dam member arranged on the first dam member, and a third dam member arranged on the second dam member. An orthogonal projection of a top surface of the second dam member onto the base substrate completely falls within an orthogonal projection of a bottom surface of the third dam member onto the base substrate, and an edge of the orthogonal projection of the top surface of the second dam member onto the base substrate is spaced apart by a certain distance from an edge of the orthogonal projection of the bottom surface of the third dam member onto the base substrate.

In the above embodiments of the present disclosure, the pixel definition layer transitional pattern includes the first dam member, the second dam member arranged on the first dam member, and the third dam member arranged on the second dam member. Of course, the pixel definition layer transitional pattern may merely include the second dam member and the third dam member arranged on the second dam member. The orthogonal projection of the top surface of the second dam member onto the base substrate completely falls within the orthogonal projection of the bottom surface of the third dam member onto the base substrate, and the edge of the orthogonal projection of the top surface of the second dam member onto the base substrate is spaced apart by a certain distance from the edge of the orthogonal projection of the bottom surface of the third dam member onto the base substrate. In this way, when the first photosensitive material layer is exposed for the first time, the entire first photosensitive material layer, rather than a portion thereof, may be exposed.

Because the undercut is formed at the lateral surface of the pixel definition layer transitional pattern, the subsequent formation of a whole layer of cathode may be adversely affected. Prior to the formation of the cathode, it is necessary to remove the undercut to obtain the pattern of the pixel definition layer. The removing the undercut to obtain the pattern of the pixel definition layer includes:

heating the pixel definition layer transitional pattern to melt a part of the pixel definition layer transitional pattern, in such a manner to enable lateral surfaces of the first dam member, the second dam member and the third dam member to be connected as a gentle slope, thereby to obtain the pattern of the pixel definition layer.

In this way, when the cathode is formed on the substrate with the pattern of the pixel definition layer subsequently, it is able to form the cathode with a continuous surface-like structure.

To be specific, the heating the pixel definition layer transitional pattern includes:

heating the pixel definition layer transitional pattern at a temperature of 80° C. to 100° C. for 12 to 48 hours.

In some embodiments of the present disclosure, the first photosensitive material layer has a thickness D, and a thickness d of the exposed layer is $\frac{1}{10}D$ to $\frac{1}{5}D$.

In some embodiments of the present disclosure, a thickness d1 of the second photosensitive material layer is $\frac{1}{5}D$ to $\frac{1}{3}D$, and d1 is greater than d.

In some embodiments of the present disclosure, the forming the pixel definition layer transitional pattern includes: forming the first photosensitive material layer; exposing the entire first photosensitive material layer; forming the second photosensitive material layer on the exposed first photosensitive material layer; exposing portions of the first photosensitive material layer and the second photosensitive material layer not shielded by the light-shielding pattern of the mask plate; and developing the exposed first photosensitive material layer and the exposed second photosensitive material layer, so as to form the pixel definition layer transitional pattern. The pixel definition layer transitional pattern includes a second dam member and a third dam member arranged on the second dam member. An orthogonal projection of a top surface of the second dam member onto the base substrate completely falls within an orthogonal projection of a bottom surface of the third dam member onto the base substrate, and an edge of the orthogonal projection of the top surface of the second dam member onto the base substrate is spaced apart by a certain distance from an edge of the orthogonal projection of the bottom surface of the third dam member onto the base substrate.

In a possible embodiment of the present disclosure, the entire first photosensitive material layer is exposed for the first time.

Because the undercut is formed at the lateral surface of the pixel definition layer transitional pattern, the subsequent formation of a whole layer of cathode may be adversely affected. Prior to the formation of the cathode, it is necessary to remove the undercut, so as to obtain the pattern of the pixel definition layer. The removing the undercut so as to obtain the pattern of the pixel definition layer includes heating the pixel definition layer transitional pattern to melt a part of the pixel definition layer transitional pattern, in such a manner to enable lateral surfaces of the second dam member and the third dam member to form a gentle slope, thereby to obtain the pattern of the pixel definition layer.

In this way, when the cathode is formed on the substrate with the pattern of the pixel definition layer subsequently, it is able to form the cathode with a continuous surface-like structure.

In a possible embodiment of the present disclosure, the heating the pixel definition layer transitional pattern includes heating the pixel definition layer transitional pattern at a temperature of 80° C. to 100° C. for 12 to 48 hours.

In a possible embodiment of the present disclosure, the forming the common layer includes forming the common layer on the base substrate with the pixel definition layer transitional pattern. The common layer is broken at the lateral surface of the pixel definition layer transitional pattern in such a manner that one portion thereof is located at a pixel region defined by the pixel definition layer transitional pattern and the other portion thereof is located at a top surface of the pixel definition layer transitional pattern.

The common layer may include a hole transport layer and/or an electron transport layer, and it may further include a hole injection layer and/or an electron injection layer. The common layer may be formed through evaporation or printing.

In a possible embodiment of the present disclosure, the forming the common layer includes: forming the hole injection layer and the hole transport layer sequentially on the base substrate, each of the hole injection layer and the hole transport layer being broken at the lateral surface of the pixel definition layer transitional pattern, one portion of each of the hole injection layer and the hole transport layer being located at the pixel region, the other portion being located at the top surface of the pixel definition transitional pattern; and forming the electron transport layer and the electron injection layer sequentially, each of the electron transport layer and the electron injection layer being broken at the lateral surface of the pixel definition layer transitional pattern, one portion of each of the electron transport layer and the electron injection layer being located at the pixel region, the other portion being located at the top surface of the pixel definition transitional pattern.

The present disclosure further provides in some embodiments a display substrate manufactured through the above-mentioned method. A pattern of a pixel definition layer includes a first film layer and a second film layer, and the first film layer is arranged at a side of the second film layer adjacent to a base substrate, and an etching rate of the first film layer is larger than an etching rate of the second film layer.

According to the embodiments of the present disclosure, the undercut is formed at the lateral surface of the pixel definition layer transitional pattern. When the common layer is formed on the base substrate with the pixel definition layer transitional pattern, the common layer may be broken at the lateral surface of the pixel definition layer transitional pattern. At this time, one portion of the common layer is located at a pixel region defined by the pixel definition layer transitional pattern, and the other portion of the common layer is located at a top surface of the pixel definition layer transitional pattern, so the portions of the common layer at different pixel regions are separated from each other. As a result, the holes to be provided to each subpixel are incapable of being transported to an adjacent subpixel via the common layer, so as to prevent the occurrence of the leakage current between the adjacent subpixels, thereby to improve display quality of a display device.

Optionally, the pattern of the pixel definition layer further includes a third film layer arranged at a side of the first film layer adjacent to the base substrate, and an etching rate of the third film layer is smaller than the etching rate of the first film layer.

The present disclosure further provides in some embodiments a display device including the above-mentioned display substrate. The display device may be any product or member having a display function, e.g., an OLED panel, a television, a display, a digital photo frame, a mobile phone or a flat-panel computer. The display device may further include a flexible circuit board, a printed circuit board and a back plate.

The method for manufacturing the display substrate will be described hereinafter in more details in conjunction with the drawings. The method may include the following step a to step i.

Step a: as shown in FIG. 1, a thin film transistor array 2, a planarization layer 3 and an anode 4 may be formed on a base substrate 1.

The base substrate 1 may be a flexible or rigid substrate. The thin film transistor array 2 includes a plurality of driving thin film transistors capable of driving organic light-emitting elements to emit light. The anode 4 is connected to a drain electrode of each driving thin film transistor.

Figure 2:
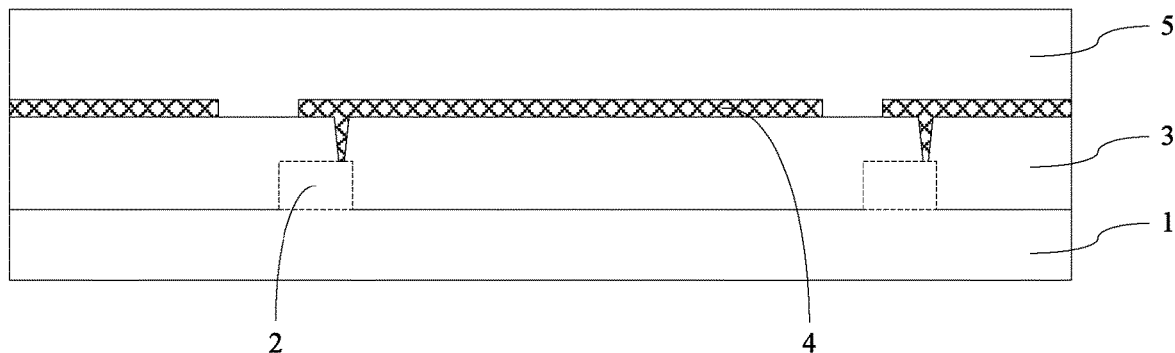
FIG. 2 is a schematic diagram showing the formation of a first photosensitive material layer on the base substrate according to one embodiment of the present disclosure.

Step b: as shown in FIG. 2, the first photosensitive material layer 5 may be formed on the base substrate 1 acquired after step a.

To be specific, a layer of organic photosensitive resin may be coated onto the base substrate 1 acquired after step a, so as to obtain the first photosensitive material layer 5.

Figure 3:
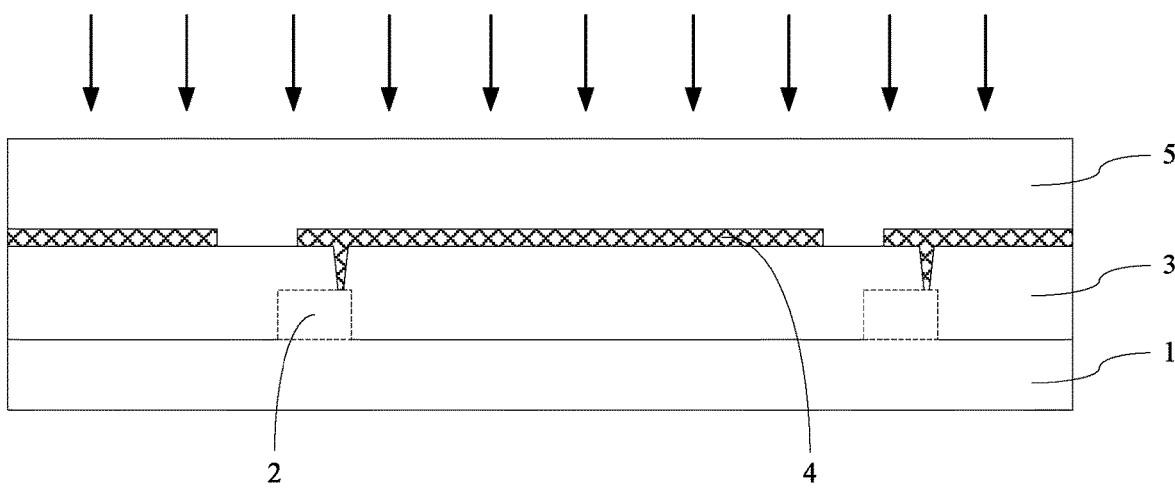
FIG. 3 is a schematic diagram showing a situation where the first photosensitive material layer is exposed according to one embodiment of the present disclosure.

Step c: as shown in FIG. 3, the entire first photosensitive material layer 5 on the base substrate 1 may be exposed.

Figure 4:
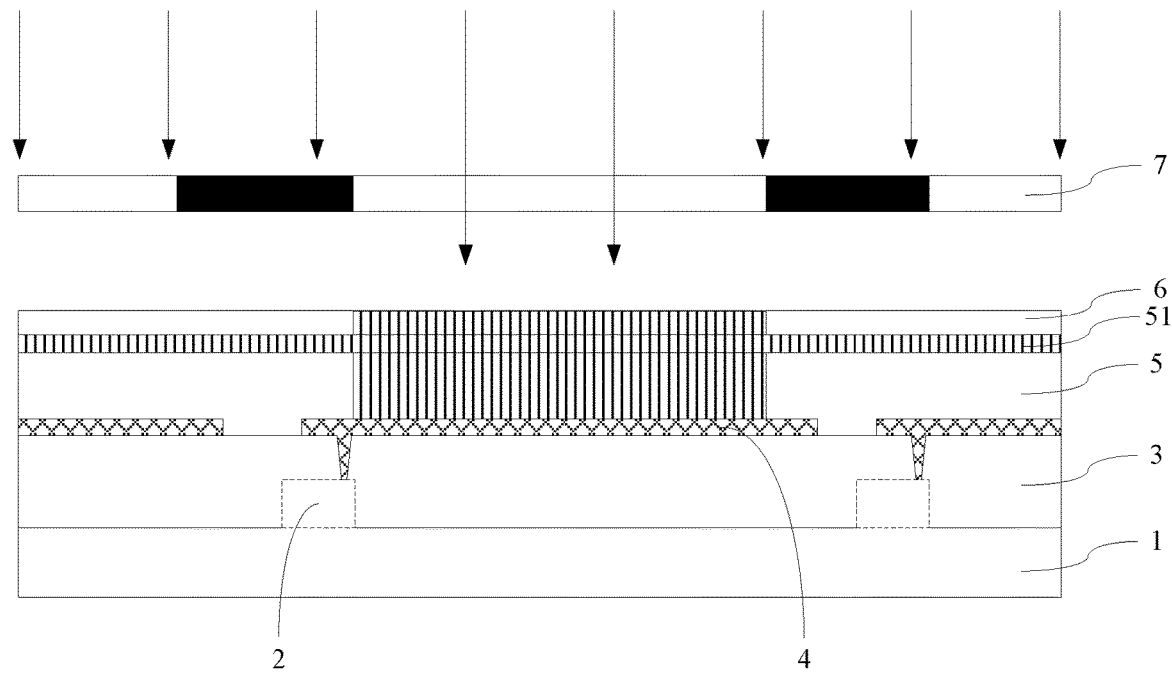
FIG. 4 is a schematic diagram showing a situation where a second photosensitive material layer and the first photosensitive material layer are exposed according to one embodiment of the present disclosure.

In this step, the entire first photosensitive material layer 5 on the base substrate 1 may be exposed without any mask plate. During the exposure, an exposure dose may be controlled. For example, when the first photosensitive material layer 5 having a thickness D may be exposed completely at an exposure dose a, the exposure dose b adopted in this step needs to be smaller than a, so as to merely expose a portion of the first photosensitive material layer having a thickness d. Preferably, d may be about $\frac{1}{10}D$ to $\frac{1}{5}D$. After the exposure, as shown in FIG. 4, an exposed layer 51 may be formed on the first photosensitive material layer 5, and a thickness of the exposed layer 51 may determine a size of the subsequently-formed undercut at the lateral surface of the pixel definition layer transitional pattern. When the thickness of the exposed layer 51 is too large, it is difficult to form the pattern of the pixel definition layer with a smooth lateral surface subsequently. When the thickness of the exposed layer 51 is too small, the undercut at the lateral surface of the pixel definition layer transitional pattern may be of a too small size, and during the subsequent deposition of the common layer, the common layer may not be broken easily. Hence, preferably, the thickness of the exposed layer 51 may be $\frac{1}{10}$D to $\frac{1}{5}$D.

Step d: as shown in FIG. 4, a second photosensitive material layer 6 may be formed on the exposed first photosensitive material layer 5, and portions of the first photosensitive material layer 5 and the second photosensitive material layer 6 not shielded by a light-shielding pattern of a mask plate 7 may be exposed.

To be specific, an organic photosensitive resin layer having a thickness d1 may be coated onto the first photosensitive material layer 5, so as to form the second photosensitive material layer 6. Preferably, d1 may be about $\frac{1}{5}$D to $\frac{1}{3}$D, and d1 may be larger than d. An entire array substrate may be exposed through the mask plate 7. The mask plate 7 includes the light-shielding pattern corresponding to the pattern of a pixel definition layer and a transparent pattern. In this step, the first photosensitive material layer 5 and the second photosensitive material layer 6 may be completely exposed at a sufficient exposure dose, i.e., the entire first photosensitive material layer 5 also needs to be completely exposed.

Figure 5:
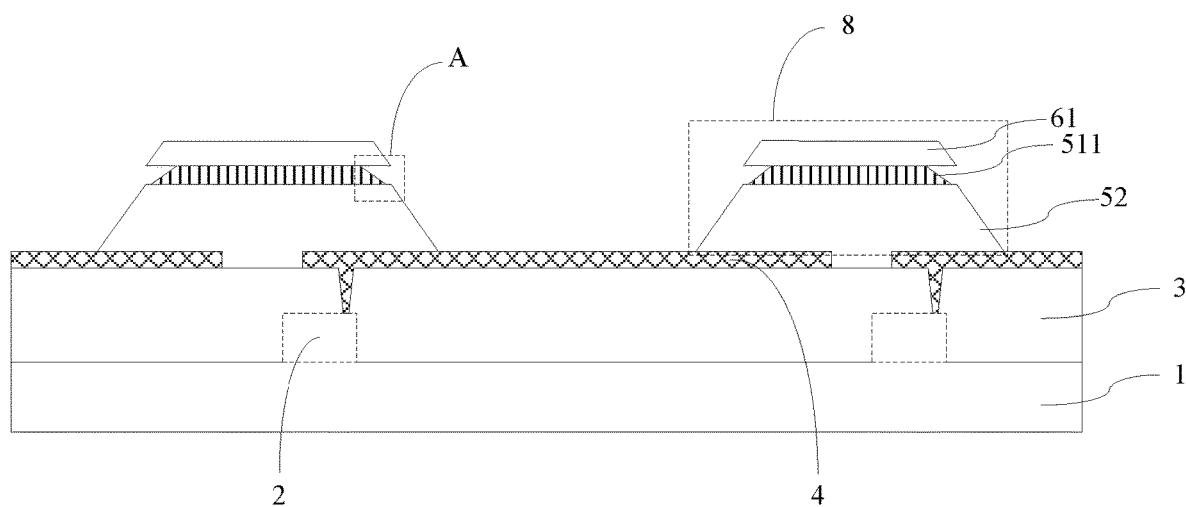
FIG. 5 is a schematic diagram showing a situation where the first photosensitive material and the second photosensitive material layer are developed according to one embodiment of the present disclosure.

Step e: as shown in FIG. 5, the exposed first photosensitive material layer 5 and the exposed second photosensitive material layer 6 may be developed, so as to form the pixel definition layer transitional pattern 8. The pixel definition layer transitional layer 8 includes a first dam member 52, a second dam member 511 arranged on the first dam member 52 and a third dam member 61 arranged on the second dam member 511. An orthogonal projection of a top surface of the second dam member 511 onto the base substrate 1 completely falls within an orthogonal projection of a bottom surface of the third dam member 61 onto the base substrate 1, and an edge of the orthogonal projection of the top surface of the second dam member 511 onto the base substrate 1 is spaced apart by a certain distance from an edge of the orthogonal projection of the bottom surface of the third dam member 61 onto the base substrate 1.

The pixel definition layer transitional pattern 8 may include: the first dam member 52, the second dam member 511 arranged on the first dam member 52 and the third dam member 61 arranged on the second dam member 511. The second dam member 511 may be exposed twice, so during the development, it may react with a development agent sufficiently. After the development, the second dam member 511 may be indented inward relative to the first dam member 52 and the third dam member 61, so as to form the undercut. Due to the undercut formed by the second dam member 511, the lateral surface of the pixel definition layer transitional pattern 8 may be broken, as indicated by region A in FIG. 5.

Figure 6:
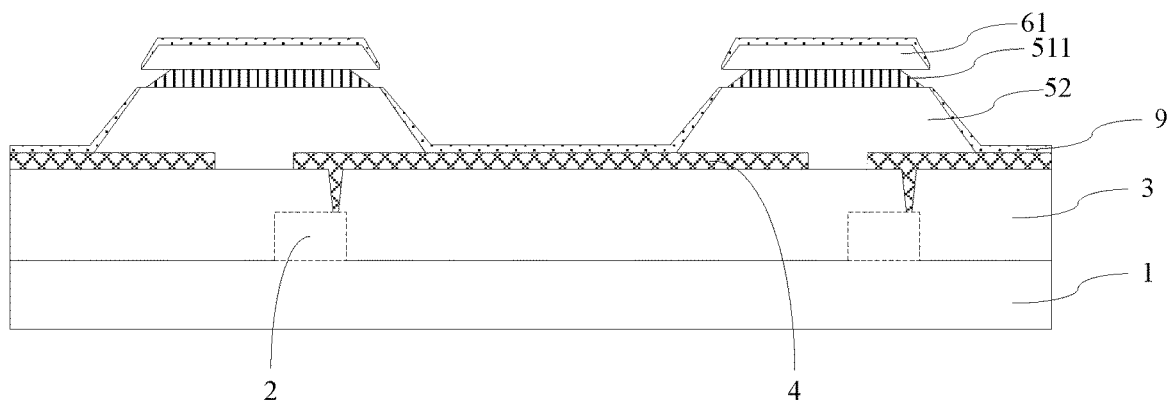
FIG. 6 is a schematic diagram showing the formation of a hole injection layer and a hole transport layer according to one embodiment of the present disclosure.

Step f: as shown in FIG. 6, a hole injection layer (HIL) and a hole transport layer (HTL) 9 may be formed on an upper surface of the entire array substrate through evaporation.

Usually, each organic light-emitting element of an OLED display device includes the hole injection layer, the hole transport layer, an organic light-emitting layer, an electron transport layer (ETL) and an electron injection layer (EIL) laminated one on another. Of course, one or more of these layers may be omitted. The hole injection layer, the hole transport layer, the electron transport layer and the electron injection layer cover an anode of each subpixel and the pixel definition layer, so one or more of these layers may be defined as the common layer.

For ease of description, the hole injection layer and the hole transport layer in FIG. 6 are combined as one layer, i.e., a layer 9. As shown in FIG. 6, due to the undercut at the lateral surface of the pixel definition layer transitional pattern 8, the hole injection layer and the hole transport layer may be broken at region A automatically during the deposition, so a portion of each of the hole injection layer and the hole transport layer on an upper portion of the pixel definition layer transitional pattern 8 may not be connected to the other portion on a lower portion of the pixel definition layer transitional pattern 8, and the portion of each of the hole injection layer and the hole transport layer on the lower portion of the pixel definition layer transitional pattern 8 may be located at a corresponding pixel region.

Figure 7:
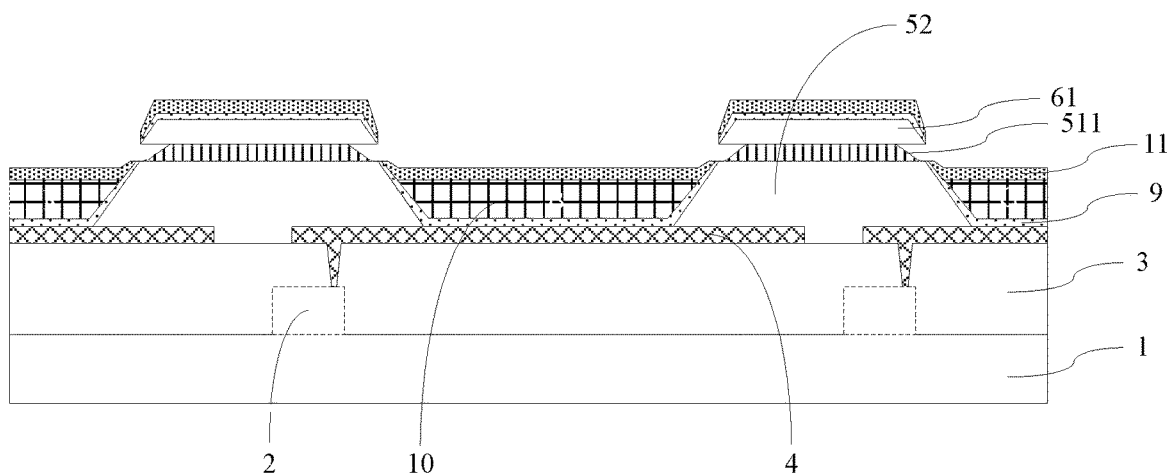
FIG. 7 is a schematic diagram showing the formation of an electron transport layer and an electron injection layer according to one embodiment of the present disclosure.
Figure 8:
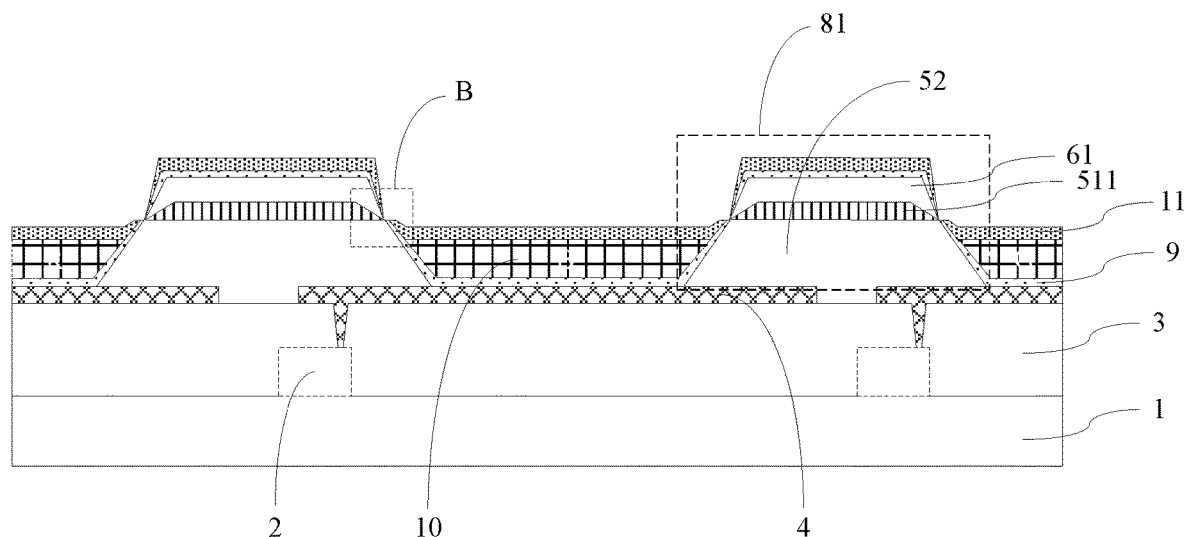
FIG. 8 is a schematic diagram showing a situation where a pixel definition layer transitional pattern is heated according to one embodiment of the present disclosure.

Step g: as shown in FIG. 7, organic light-emitting material layers 10 in various colors, e.g., red (R), blue (B) and green (G), may be formed at different pixel regions through evaporation, and the electron transport layer and the electron injection layer may be formed on each organic light-emitting material layer 10 through evaporation. The electron transport layer and the electron injection layer are also parts of the common layer. As shown in FIG. 8, the electron transport layer and the electron injection layer are combined as one layer, i.e., a layer 11. due to the undercut at the lateral surface of the pixel definition layer transitional pattern 8, the electron transport layer and the electron injection layer may be broken at region A automatically during the deposition, so a portion of each of the electron transport layer and the electron injection layer on an upper portion of the pixel definition layer transitional pattern 8 may not be connected to the other portion on a lower portion of the pixel definition layer transitional pattern 8, and the portion of each of the electron transport layer and the electron injection layer on the lower portion of the pixel definition layer transitional pattern 8 may be located at a corresponding pixel region.

It can be seen that, the portions of the common layer at different pixel regions may be separated from each other, i.e., may not be connected to each other.

Step h: as shown in FIG. 8, the pixel definition layer transitional pattern 8 and the common layer may be heated. At the region A, the second dam member 511 is indented inward, so the third dam member 61 arranged on the second dam member 511 and the common layer on the third dam member 61 may be suspended in the midair. During the heating, the melted third dam member 61 and the melted common layer may flow downward, so as to remove the undercut at the lateral surface of the pixel definition layer transitional pattern 8, thereby to form the pattern 81 of the pixel definition layer with a gentle lateral surface.

The pixel definition layer transitional pattern 8 and the common layer may be heated under a specific condition, e.g., at a temperature of 80° C. to 100° C., or less, for 12 to 48 hours, especially at a temperature of 95° C. for 24 hours. After the heating, as shown in FIG. 8, the region A may become a region B, and the pixel definition layer transitional pattern 8 may become the pattern 81 of the pixel definition layer with a smooth slope as the lateral surface. It should be appreciated that, although the lateral surface of the pattern 81 of the pixel definition layer is the smooth slope, through controlling the heating temperature and the heating time period, a portion of the common layer at a top surface of the pattern 81 of the pixel definition layer may not be connected to the portion of the common layer at the pixel region.

Figure 9:
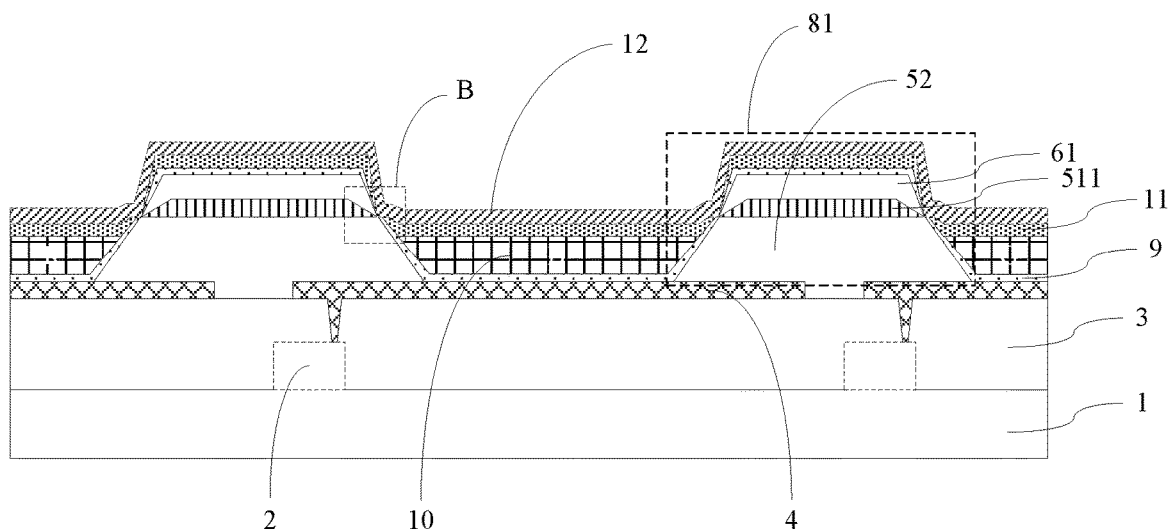
FIG. 9 is a schematic diagram showing the formation of a cathode according to one embodiment of the present disclosure.

Step i: as shown in FIG. 9, a cathode 12 of the OLED display device may be formed on an upper surface of the entire array substrate through evaporation or any other process. As shown in FIG. 9, after the heating, the lateral surface of the pattern 81 of the pixel definition layer is a continuous and gentle surface. Hence, the cathode 12 formed at the region B may not be broken like the common layer, and instead, it may be of a continuous surface-like structure.

The OLED display substrate may be acquired through the above step a to step i. It should be appreciated that, a type of the OLED display substrate will not be particularly defined herein, i.e., the OLED display substrate may be of a top-emission or bottom-emission type.

According to the embodiments of the present disclosure, the undercut is formed at the lateral surface of the pixel definition layer transitional pattern. When the common layer is formed on the base substrate with the pixel definition layer transitional pattern, the common layer may be broken at the lateral surface of the pixel definition layer transitional pattern. At this time, one portion of the common layer is located at a pixel region defined by the pixel definition layer transitional pattern, and the other portion of the common layer is located at a top surface of the pixel definition layer transitional pattern, so the portions of the common layer at different pixel regions are separated from each other. As a result, the holes to be provided to each subpixel are incapable of being transported to an adjacent subpixel via the common layer, so as to prevent the occurrence of the leakage current between the adjacent subpixels, thereby to prevent the occurrence of such defects as crosstalk and light leakage for the OLED display device as well as improve the display effect of the display device.

Unless otherwise defined, any technical or scientific term used herein shall have the common meaning understood by a person of ordinary skills. Such words as "first" and "second" used in the specification and claims are merely used to differentiate different components rather than to represent any order, number or importance. Similarly, such words as "one" or "one of" are merely used to represent the existence of at least one member, rather than to limit the number thereof. Such words as "connect" or "connected to" may include electrical connection, direct or indirect, rather than to be limited to physical or mechanical connection. Such words as "on", "under", "left" and "right" are merely used to represent relative position relationship, and when an absolute position of the object is changed, the relative position relationship will be changed too.

It should be appreciated that, in the case that such an element as layer, film, region or substrate is arranged "on" or "under" another element, it may be directly arranged "on" or "under" the other element, or an intermediate element may be arranged therebetween.

The above embodiments are preferred embodiments of the present disclosure. It should be noted that, a person skilled in the art may make further improvements and modifications without departing from the principle of the present disclosure, and these improvements and modifications shall also fall within the scope of the present disclosure.

What is claimed is:

1. A display substrate, comprising a base substrate and a pixel definition layer arranged on the base substrate, wherein the pixel definition layer comprises a first film layer and a second film layer, the first film layer is arranged at a side of the second film layer adjacent to the base substrate, and an orthogonal projection of a top surface of the first film layer onto the base substrate completely falls within an orthogonal projection of a bottom surface of the second film layer onto the base substrate, wherein the first film layer comprises a first dam member and a second dam member, the second dam member is arranged at a side of the first dam member away from the base substrate, wherein the second film layer comprises a third dam member, an orthogonal projection of a top surface of the second dam member onto the base substrate completely falls within an orthogonal projection of a bottom surface of the third dam member onto the base substrate, and an edge of the orthogonal projection of the top surface of the second dam member onto the base substrate is spaced apart by a certain distance from an edge of the orthogonal projection of the bottom surface of the third dam member onto the base substrate.

2. The display substrate according to claim 1, wherein an edge of the orthogonal projection of the top surface of the first film layer onto the base substrate is spaced apart by a certain distance from an edge of the orthogonal projection of the bottom surface of the second film layer onto the base substrate.

3. The display substrate according to claim 1, wherein an orthogonal projection of a top surface of the first dam member onto the base substrate coincides an orthogonal projection of a bottom surface of the second dam member onto the base substrate.

4. The display substrate according to claim 1, wherein an orthogonal projection of a bottom surface of the second dam member onto the base substrate completely falls within an orthogonal projection of a top surface of the first dam member onto the base substrate.

5. The display substrate according to claim 1, wherein an orthogonal projection of a top surface of the second dam member onto the base substrate completely falls within an orthogonal projection of a top surface of the first dam member onto the base substrate.

6. The display substrate according to claim 1, wherein the first dam member, the second dam member, the third dam member have different patterns and/or thicknesses.

7. The display substrate according to claim 1, further comprising a common layer that is broken at a boundary between the first film layer and the second film layer.

8. The display substrate according to claim 6, wherein a sum of a thickness of the first dam member and a thickness of the second dam member is D, the thickness of the first dam member is $\frac{1}{10}D$ to $\frac{1}{5}D$, a thickness of the third dam member is $\frac{1}{5}D$ to $\frac{1}{3}D$.

9. A display device comprising the display substrate according to claim 1.

10. A method for manufacturing a display substrate, comprising:

forming a pixel definition layer transitional pattern on a base substrate, the pixel definition layer transitional pattern being provided at a lateral surface with an undercut; and removing the undercut to obtain a pattern of a pixel definition layer;

wherein the forming the pixel definition layer transitional pattern on the base substrate comprises:

forming at least two dam members on the base substrate, wherein the at least two dam members are located in a direction perpendicular to the base substrate, the pixel definition layer transitional pattern comprises the at least two dam members, and the undercut is formed between two of the at least two dam members, wherein the forming the at least two dam members on the base substrate comprises:

forming, on the base substrate, a first dam member, a second dam member arranged on the first dam member and a third dam member arranged on the second dam member, wherein an orthogonal projection of a top surface of the second dam member onto the base substrate completely falls within an orthogonal projection of a bottom surface of the third dam member onto the base substrate, and an edge of the orthogonal projection of the top surface of the second dam member onto the base substrate is spaced apart by a certain distance from an edge of the orthogonal projection of the bottom surface of the third dam member onto the base substrate.

11. The method according to claim 10, wherein the forming, on the base substrate, the first dam member, the second dam member arranged on the first dam member and the third dam member arranged on the second dam member comprises:
  forming a first photosensitive material layer;
  exposing a portion of the first photosensitive material layer having a thickness d relative to an upper surface of the first photosensitive material layer to form a fully exposed film layer, the first photosensitive material layer having a thickness D, and D being larger than d;
  forming a second photosensitive material layer on the exposed first photosensitive material layer;
  exposing portions of the first photosensitive material layer and the second photosensitive material layer not shielded by a light-shielding pattern of a mask plate, an orthogonal projection of the light-shielding pattern onto the base substrate overlapping an orthogonal projection of the pixel definition layer onto the base substrate; and
  developing the exposed first photosensitive material layer and the exposed second photosensitive material layer to form the first dam member, the second dam member and the third dam member.

12. The method according to claim 11, wherein the thickness d of the fully exposed film layer is $\frac{1}{10}D$ to $\frac{1}{5}D$.

13. The method according to claim 12, wherein a thickness d1 of the second photosensitive material layer is $\frac{1}{5}D$ to $\frac{1}{3}D$, and d1 is larger than d.

14. The method according to claim 10, wherein the forming, on the base substrate, the second dam member and the third dam member arranged on the second dam member comprises:
  forming a first photosensitive material layer;
  exposing the entire first photosensitive material layer;
  forming a second photosensitive material layer on the exposed first photosensitive material layer;
  exposing portions of the first photosensitive material layer and the second photosensitive material layer not shielded by a light-shielding pattern of a mask plate, an orthogonal projection of the light-shielding pattern onto the base substrate overlapping an orthogonal projection of the pixel definition layer onto the base substrate; and
  developing the exposed first photosensitive material layer and the exposed second photosensitive material layer to form the second dam member and the third dam member.

15. The method according to 10, further comprising: forming the common layer, that is broken at the undercut, on the base substrate.

16. The method according to claim 15, wherein the forming the common layer, that is broken at the undercut, on the base substrate comprises:
  forming the common layer on the base substrate, wherein the common layer comprises a first common layer portion at a pixel region defined by the pixel definition layer transitional pattern and a second common layer portion at a top surface of the pixel definition layer transitional pattern, and the first common layer portion and the second common layer portion are unconnected to each other.

17. The method according to claim 16, wherein the forming the common layer on the base substrate comprises:
  forming a hole injection layer and a hole transport layer sequentially on the base substrate, each of the hole injection layer and the hole transport layer being broken at the undercut at the lateral surface of the pixel definition layer transitional pattern, one portion of each of the hole injection layer and the hole transport layer being located at the pixel region, the other portion being located at the top surface of the pixel definition transitional pattern; and
  forming an electron transport layer and an electron injection layer sequentially, each of the electron transport layer and the electron injection layer being broken at the undercut at the lateral surface of the pixel definition layer transitional pattern, one portion of each of the electron transport layer and the electron injection layer being located at the pixel region, the other portion being located at the top surface of the pixel definition transitional pattern.

18. The method according to claim 10, further comprising: forming a cathode on the base substrate.

* * * * *